(12) United States Patent
Lutze et al.

(10) Patent No.: US 6,262,455 B1
(45) Date of Patent: Jul. 17, 2001

(54) METHOD OF FORMING DUAL GATE OXIDE LAYERS OF VARYING THICKNESS ON A SINGLE SUBSTRATE

(75) Inventors: Jeffrey Lutze, San Jose; Emmanuel de Muizon, Fremont, both of CA (US)

(73) Assignee: Philips Semiconductor, Inc., Tarrytown, NY (US)

( * ) Notice: Subject to any disclaimer, the term of this patent is extended or adjusted under 35 U.S.C. 154(b) by 0 days.

(21) Appl. No.: 09/431,841

(22) Filed: Nov. 2, 1999

(51) Int. Cl.$^7$ ...................................... H01L 29/72
(52) U.S. Cl. .................. 257/369; 257/333; 257/288; 257/390; 257/401; 257/402; 257/411; 438/154; 438/155; 438/197; 438/694
(58) Field of Search ..................... 257/369, 390, 257/401, 402, 411, 333, 288; 438/154, 155, 197, 694

(56) References Cited

U.S. PATENT DOCUMENTS 5,668,035 * 9/1997 Fang et al. ......................... 438/239

OTHER PUBLICATIONS

Han et al., "Electrical Characteristics and Reliability of Sub 3nm Gate Oxides Grown on Nitrogen Implanted Silicon Substrates,"0 IEDM Tech. Dig. p. 643, 1997.

Tseng et al., "Thin CVD Stacked Gate Dielectric for ULSI Technology," IEDM Tech. Dig. p. 321, 1993.

Eimori et al., "ULSI DRAM with Stacked Capacitor Cells for Low Voltage Operation," IEDM Tech. Dig. p. 45, 1993.

* cited by examiner

Primary Examiner—Edward Wojciechowicz

(57) ABSTRACT

A method for manufacturing a semiconductor device that includes dual gate oxide layers made of two dielectric layers of varying thickness on a single wafer. In an example embodiment, a semiconductor structure is fabricated by providing a first layer of a dielectric over a semiconductor material and covering the first layer with a protective second dielectric layer adapted to mask the first layer. The first and second layers are then removed over a region of the semiconductor material while the second layer is used to protect the first layer, therein leaving the region of semiconductor material substantially exposed. A third layer of dielectric material is formed over the first and second layers and the adjacent exposed semiconductor material region; a gate material is then formed over the third dielectric layer. Finally, an etching step etches through the gate material and underlying layers to the semiconductor material to form a thick gate region and a thin gate region. The thick and thin gate regions can be formed on the same substrate using substantially the same manufacturing process.

20 Claims, 4 Drawing Sheets

METHOD OF FORMING DUAL GATE OXIDE LAYERS OF VARYING THICKNESS ON A SINGLE SUBSTRATE

FIELD OF THE INVENTION

The present invention relates generally to the manufacture of semiconductor devices and, more particularly, to the manufacture of multiple field effect transistor (FETs) devices on a single wafer having layers of dielectric of varying thickness.

BACKGROUND OF THE INVENTION

In recent years, the semiconductor industry has realized tremendous advances in technology that have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second) to be packaged in relatively small, air-cooled semiconductor device packages. Many of the integrated circuits formed on semiconductor substrates are comprised of several circuit functions on the single chip. Such devices include, for example, nonvolatile memory (NVM) memory devices and DRAMs (dynamic random access memory) which are composed of an array of memory cells for storing digital information. The peripheral circuits on these devices are typically composed of logic circuits for addressing the memory cells, while other peripheral circuits function as read/write buffers and sense amplifiers. Commercially, the drive for increased portability and continuous use while reducing size and weight of electronic hand-held devices has put more pressure on chip manufacturers to find ways to handle these requirements while reducing the chip size.

To improve performance and optimize these devices, it is very desirable in the electronics industry to provide FETs that have both thin and thick gate dielectric layers, usually oxide layers. A thin gate dielectric layer is used in the peripheral (logic) circuits to enhance FET device performance, while it is desirable to provide a thicker gate dielectric layer for the higher gate voltage requirements of analog and I/O circuits. For example, the FETs in the logic circuits would have a gate voltage of about 3.3 volts. On the other hand, the access transistor in analog and I/O circuits often require a significantly higher gate voltage.

A current approach to making these types of devices uses a grow-etch-grow process. In using the grow-etch-grow process to form the thick and thin gate oxides, the thick oxide layer is partially grown first. A photoresist mask is then provided over the thick gate layer region while etching the oxide from the thin gate regions; the entire wafer is then exposed to thin gate oxide growth. One drawback to this method, however, is that the photoresist mask contaminates the oxide and degrades the device's electrical characteristics. One such contaminant is the mobile sodium (Na) ion in the gate oxide that affects the long-term stability of the gate voltage on the is FET. Another drawback to this method is that it leads to higher defects in the oxide layer, as the initial thick gate oxide layer is exposed to the thin gate oxide preclean process. Attack of the thick gate oxide during the thin gate preclean process leads to formation of defects in the thick gate oxide.

There is a need to provide a method for forming the thin and thick gate oxides on a semiconductor substrate without the photoresist layer causing contamination of the gate oxide and without damaging the thick oxide layer during a thin gate preclean process.

SUMMARY OF THE INVENTION

The present invention is directed to a multiple layer gate oxide manufacturing method that does not expose the thick gate oxide to a photoresist mask and its contaminants, and does not expose the thick gate oxide to attack by etching chemicals during the thin gate preclean process. Embodiments of the invention provide the advantage of reducing the defect density in the thick gate oxide (or dielectric) layer without adding significant process complexity in manufacturing devices with thin and thick gate regions.

An example embodiment of the present invention is directed to a method of manufacturing a semiconductor structure that includes providing a first layer of a dielectric over a semiconductor material. The first layer is covered with a protective second dielectric layer that is adapted to mask the first layer. The first and second layers are then removed over a region of the semiconductor material, using the second layer to protect the first layer, therein leaving the region of semiconductor material substantially exposed. A third layer of dielectric material is formed (e.g., grown) over the first and second layers and the adjacent exposed semiconductor material region; a gate material is then deposited over the third dielectric layer. Finally, an etching step is performed that etches through the gate material and underlying layers to the semiconductor material to form a thick gate region and a thin gate region.

Another example embodiment of the present invention is directed to a method of manufacturing a semiconductor device that includes providing a first layer of a dielectric material over a semiconductor material. The first layer is covered with a protective second dielectric layer that is adapted to mask the first layer, while a third dielectric layer is grown over the second layer. A photoresist layer is formed over a portion of the third layer and then a portion of the third layer not covered by the photoresist layer is removed. The photoresist layer is then removed, thereby forming a dielectric mask from the third layer that is disposed over a portion of the second layer. Next, a portion of the second layer not covered by the dielectric mask is removed, leaving a portion of the first layer adjacent to the second and third layers substantially exposed. The dielectric mask and the exposed portion of the first layer are removed, leaving an exposed semiconductor region adjacent the first and second layers. A fourth layer of dielectric material is formed over the first and second layers and the adjacent exposed semiconductor material region; a gate material is then formed over the fourth dielectric layer. Finally, the gate material layer is etched through to the semiconductor material to form a thick gate region and a thin gate region on the semiconductor material.

The above summary of the present invention is not intended to describe each possible embodiment or every implementation of the present invention. The figures, and the detailed description that follows, more particularly exemplify these embodiments.

DETAILED DESCRIPTION OF THE DRAWINGS

The invention may be more completely understood upon consideration of the following detailed description of various embodiments of the invention in connection with the accompanying drawings, in which.

Figure 1A:
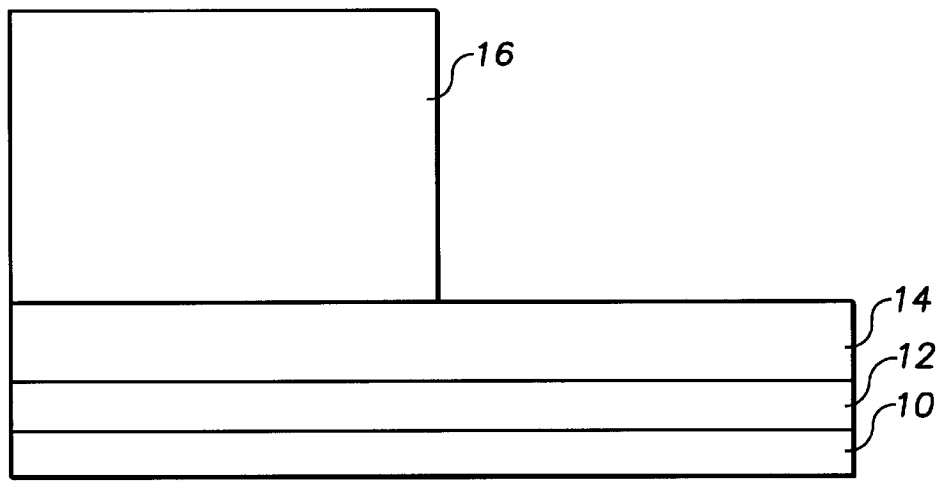
FIG. 1A illustrates an example embodiment for making a semiconductor structure, according to the teachings of the present invention, having a photoresist layer partially disposed over two dielectric layers.
Figure 1B:
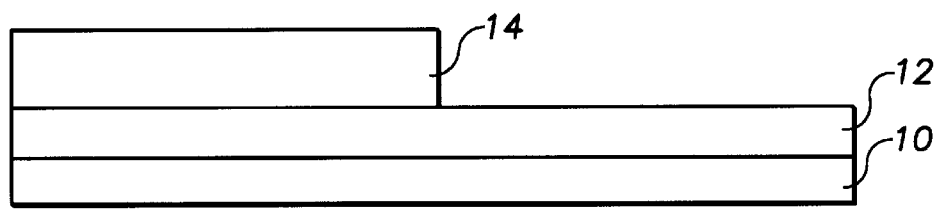
FIG. 1B illustrates the example embodiment with the photoresist mask removed and part of the top dielectic layer removed.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE INVENTION

The present invention is believed to be applicable to a variety of different types of semiconductor devices, and the invention has been found to be particularly suited for use in mixed-signal technology devices where the use of dual layers of gate oxide of varying thickness on a single substrate is desirable. On such devices, a thin gate oxide is typically used for the low power supply, high performance digital CMOS circuits; while a thick gate oxide is used to support higher power supplies for analog designs and I/O circuits. An important advantage of the present invention is that the thick gate oxide is not exposed to a photoresist mask, or its contaminants, and the thick gate oxide is not exposed to attack by etching chemicals during the thin gate preclean process. In this manner, the defect density in the thick gate oxide (or dielectric) layer is reduced without adding significant process complexity in manufacturing devices with thin and thick gate regions. While the present invention is not necessarily limited to MOS devices, appreciation of various aspects of the invention is best gained through a discussion of various example MOS-based semiconductor manufacturing methods and structures described below.

In an example embodiment of the present invention, a method of manufacturing a semiconductor structure is described that includes providing a first layer of a dielectric over a semiconductor material. The first layer is covered with a protective second dielectric layer that is adapted to mask the first layer. The first and second layers are then removed over a region of the semiconductor material, using the second layer to protect the first layer, thereby leaving the region of semiconductor material substantially exposed. A third layer of dielectric material is formed over the first and second layers and the adjacent exposed semiconductor material region; a gate material is then deposited over the third dielectric layer. Finally, an etching step etches through the gate material and underlying layers to the semiconductor material to form a thick gate region and a thin gate region.

Figure 1C:
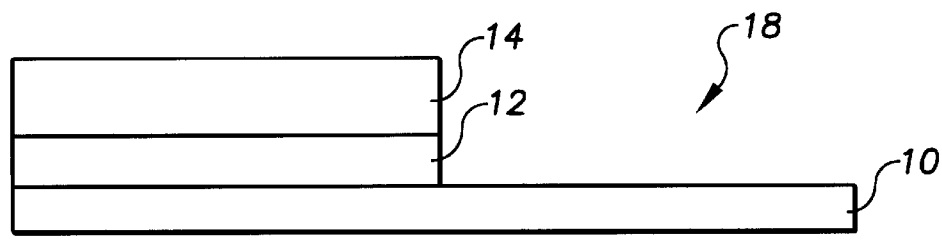
FIG. 1C illustrates the example embodiment with part of the dielectric layer above the substrate partially removed, thereby defining thick and thin gate regions on the substrate.

FIGS. 1A–1E illustrate another embodiment of the present invention directed to a specific method of manufacturing a semiconductor device having thick and thin gate regions. In FIG. 1A, after conventional isolation processing, an initial oxide layer 12 is grown over an entire wafer or substrate 10. This is followed by the deposition of a second dielectric material layer 14 (an oxide or insulative material), in this case silicon nitride. The first and second layers can also be formed from: silicon dioxide, silicon oxynitride, silicon oxyfluoride or phospho-silicate glass. The thick gate region is then masked with a photoresist 16, as in conventional processing, and second layer (nitride) 14 is etched (using wet or dry process) from the thin gate region. This is followed by removal of photoresist 16 resulting in a structure shown in FIG. 1B. In FIG. 1C, nitride layer 14 is used as a protective layer or mask for initial oxide 12, while a portion of oxide 12 is stripped from a thin gate region 18 during the thin gate preclean process. This allows the thin gate preclean process to be optimized without concern for chemical attack on the thick gate region (layers 12 and 14).

Figure 1D:
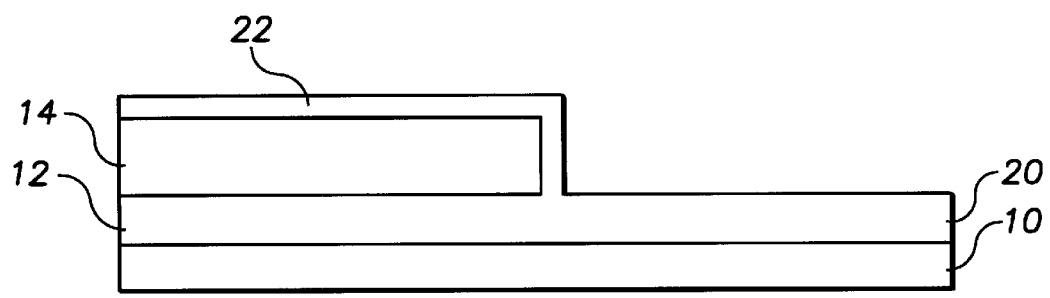
FIG. 1D illustrates the example embodiment with another dielectric layer formed over the thick and thin gate regions of the substrate.
Figure 1E:
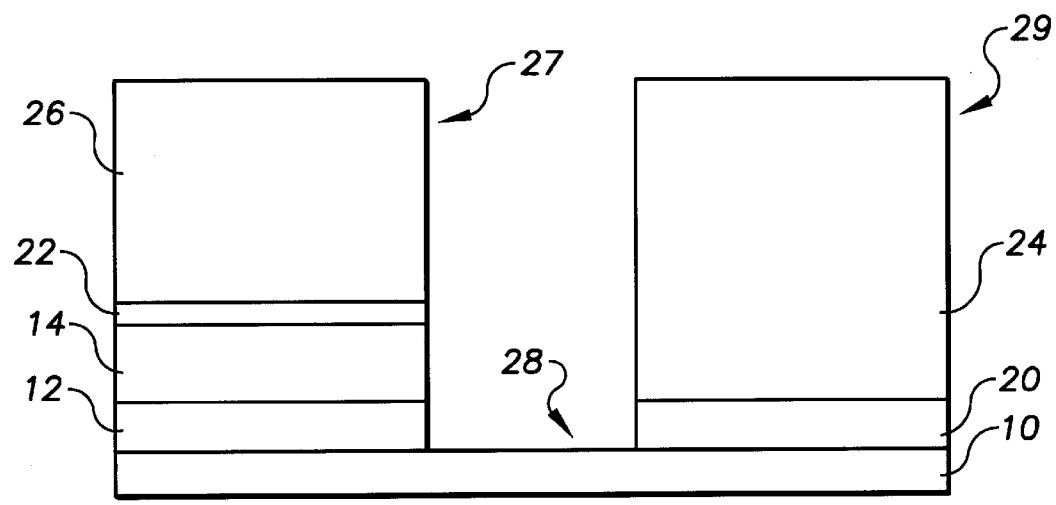
FIG. 1E illustrates the example embodiment with polysilicon formed over the thick and thin gate regions, with two devices being formed using conventional manufacturing techniques.

Referring to FIG. 1D, a thin gate oxide 20 is then grown, which forms a thin oxide layer 22 on nitride layer 14 in the thick gate region. This results in formation of an "ONO" or oxide/nitride/oxidized nitride dielectric layer in the thick gate regions, similar to what is currently used in conventional DRAM processing. As shown in FIG. 1F, polysilicon or another suitable gate material is then immediately deposited over the insulative layers on the substrate and then etched to form gate layers 24 and 26. Following conventional CMOS processing, device 27 (thick gate) and device 29 (thin gate) are formed on substrate 10. The initial oxide/nitride/ oxidized nitride stack (12, 14, 22) acts as the thick gate dielectric, while oxide 20 is the thin gate dielectric. Further, since nitride has a large dielectric constant compared to oxide, a thick nitride film could be used and still give a relatively thin effective dielectric thickness when compared to silicon dioxide or other materials.

This example method has a number of advantages. First, the initial gate oxide is not attacked in the thick gate region, which reduces the number of defects in the thick gate oxide layer. Second, because a material like silicon nitride has a higher dielectric constant than a typical oxide, a relatively thick nitride layer can be used while still maintaining a reasonably effective oxide thickness on the thick gate devices. Third, the ONO dielectric used in the thick gate device typically has a lower number of defects than the thin gate areas, because independent layers are used to form the dielectric layer such that the defects in the two films, the initial oxide and the nitride, should not coincide. Reference regarding the improvement of dielectric quality where the defects of two layers do not coincide may be made to Tseng, et al., "Thin CVD Stacked Gate Dielectric for VLSI Technology," IEDM Tech. Dig., p. 321, 1993.

An example film thickness for an initial oxide layer for thick gate device 27 is about 3 nm (first thickness). For the final nitride layer an example thickness is about 5 nm (second thickness), and for the oxidized nitride layer an example thickness is about 2 nm (third thickness). Therefore, the effective thick dielectric thickness is 3+5(3.9/7.5)+2=7.6 nm. In one application the target for this type of device should be about 8 nm. The thin gate region has a thin oxide layer with a thickness that is less than the first thickness of the first layer of the thick gate region. Where DRAM manufacturers have reduced the size of the ONO dielectric to an effective thickness of 6 nm, this technology is useable for future generation processes. For more information, reference is made to Eimori et al. "VLSI DRAM with Stacked Capacitor Cells for Low Voltage Operation," IEDM Tech. Dig. p. 45, 1993.

Another important advantage of the present invention relates to the mitigation, or prevention, of resist contamination. Realizing this advantage, FIGS. 2A–2F illustrate another embodiment of the present invention directed to a specific example method of manufacturing a semiconductor device having thick and thin gate regions. This approach is especially useful if etching of the second dielectric material, such as nitride, is not suitable with a photoresist mask process.

Figure 2A:
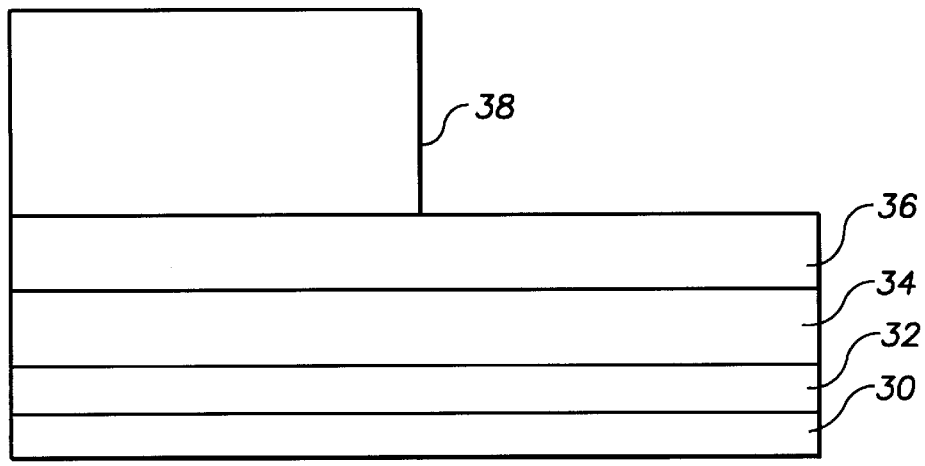
FIG. 2A illustrates an example embodiment for making a semiconductor structure, according to the teachings of the present invention, having a photoresist layer partially disposed over three dielectric layers.
Figure 2B:
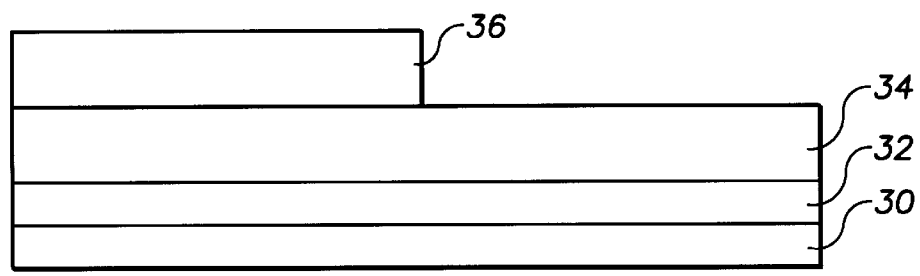
FIG. 2B illustrates the example embodiment with the photoresist mask removed and part of the top dielectric layer removed.
Figure 2C:
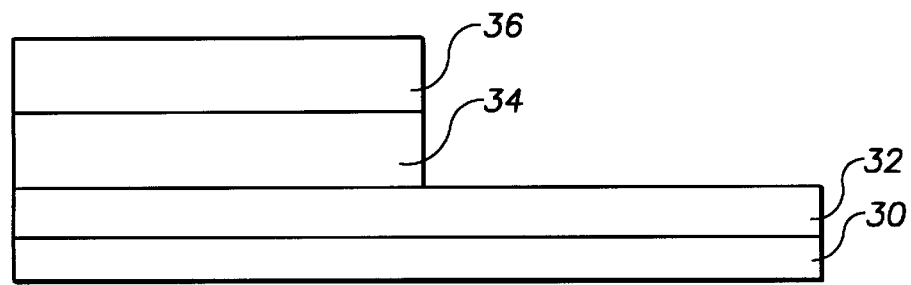
FIG. 2C illustrates the example embodiment with the top dielectric layer serving as a mask when removing part of the middle dielectric layer, therein leaving part of the lower dielectric exposed.

Referring to FIG. 2A, the process begins in the same fashion with the initial oxide growth, resulting in an oxide layer 32 on a substrate 30, and with a nitride deposition, resulting in a nitride layer 34 (in this case, silicon nitride). A third layer of oxide, oxide 36 (in this case, silicon oxide), is formed on nitride layer 34 to be used as a hard mask. This is followed by resist patterning 38 and etching of top oxide layer 36 that is exposed (see FIG. 2B), stopping on nitride layer 34 (which can be done with conventional processing). Photoresist 38 (FIGS. 2A–2C) is then stripped and oxide 36 is used as a hard mask for the nitride etch of nitride layer 34 that is exposed. The use of oxide layer 36 as a hard mask allows the use of a nitride etch, such as hot $H_3PO_4$, which is typically not suitable with a photoresist mask.

Figure 2D:
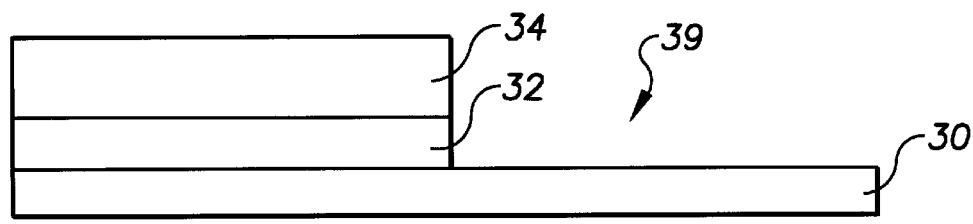
FIG. 2D illustrates the example embodiment with the upper dielectric layer removed and the lower dielectric layer above the substrate partially removed, thereby defining thick and thin gate regions on the substrate.
Figure 2E:
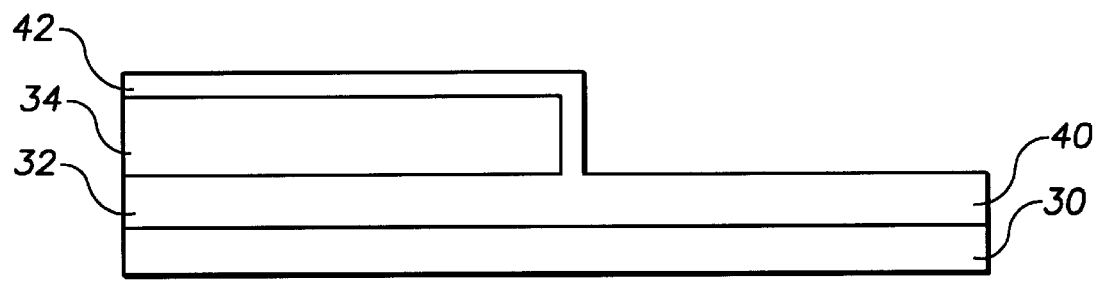
FIG. 2E illustrates the example embodiment with another dielectric layer formed over the thick and thin gate regions of the substrate.
Figure 2F:
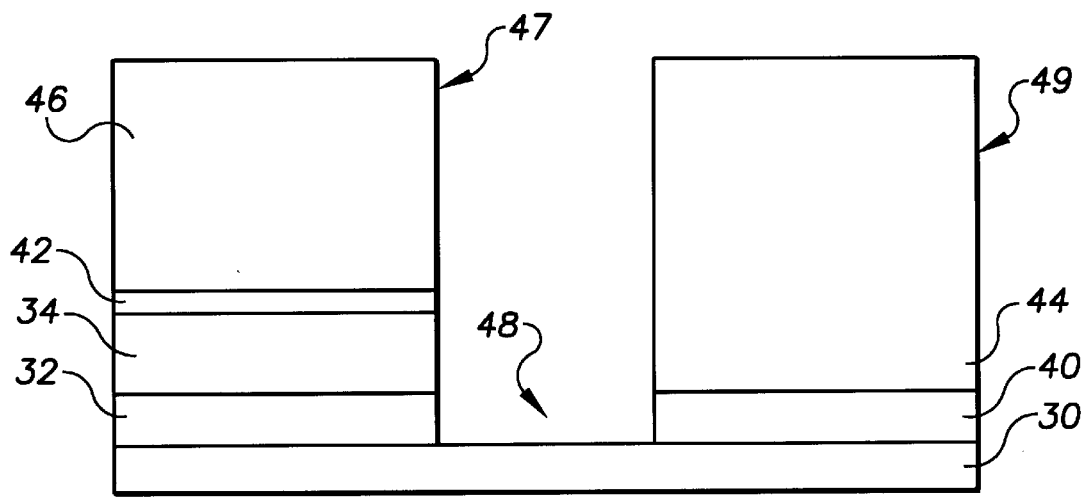
FIG. 2F illustrates the example embodiment with polysilicon formed over the thick and thin gate regions, with two devices being formed using conventional manufacturing techniques.

In FIG. 2D, the oxide etch mask, in this case oxide layer 36, is then removed along with initial oxide layer 32 in a thin gate area 39, thereby exposing wafer 30. Referring to FIG. 2E, a thin gate oxide 40 (or fourth layer) is then grown, which forms a thin oxide layer 42 on nitride layer 34 in the thick gate region. After thin gate growth, this results in the same ONO dielectric in the thick gate region. As shown in FIG. 2F, polysilicon or another suitable gate material is then immediately deposited over the layers on the substrate and etched to form gate layers 44 and 46. Following conventional CMOS processing, device 47 (thick gate) and device 49 (thin gate) are formed.

The example method uses an oxide layer as a hard mask to etch the nitride, thereby providing flexibility in the choice of etch chemistry. The method also provides flexibility in that a material other than nitride can be chosen to protect the initial oxide layer. The first, second, third and fourth layers can also be formed from: silicon dioxide, silicon oxynitride, silicon oxyfluoride or phospho-silicate glass.

As noted above, the present invention is applicable to a number of different semiconductor structures and arrangements. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. A method of manufacturing a semiconductor device, comprising:

providing a first layer of a dielectric material over a semiconductor material;

covering the first layer with a protective second dielectric layer adapted to mask the first layer;

removing the first and second layers over a region of the semiconductor material while using the second layer to protect the first layer, therein leaving a region of the semiconductor material adjacent to the two layers substantially exposed;

forming a third layer of dielectric material over the first and second layers and the adjacent exposed semiconductor material region;

depositing a gate material over the third dielectric layer; and etching the gate material layer through to said semiconductor material to form a thick gate region and a thin gate region on the semiconductor material.

2. The method according to claim 1, further comprising forming a photoresist layer over the second protective layer before removal of the first two layers.

3. The method according to claim 1, further comprising forming the first layer of a first thickness, forming the second layer with a second thickness and forming the third layer with a third thickness, wherein the three layers form part of the thick gate region and the combined effective thickness of the three layers is about 8 nm.

4. The method according to claim 3, wherein the third dielectric layer, that forms part of the thin gate region, has a thickness that is less than the first thickness of the first layer of the thick gate region.

5. The method according to claim 1, wherein the third layer is oxidized nitride.

6. The method according to claim 1, wherein the first and second layers are selected from at least one of the following: silicon dioxide, silicon nitride, silicon oxynitride, silicon oxyfluoride or phospho-silicate glass.

7. The method according to claim 3, wherein the thick gate region has dielectric layers of dissimilar materials, thereby improving dielectric quality in the thick gate region.

8. The method according to claim 1, further comprising forming a fourth layer of dielectric on the second layer, adapted to mask the second layer, before partial removal of the first two layers.

9. The method according to claim 8, further comprising forming a photoresist layer over the fourth layer.

10. The method according to claim 9, further comprising removing a portion of the fourth layer, thereby exposing a portion of the second layer, before removing the first two layers.

11. The method according to claim 10, wherein the step of removing the first two layers further includes:

removing the exposed portion of the second layer, thereby exposing a portion of the first layer that was not masked by the second and fourth layers; and removing the fourth layer and the exposed portion of the first layer, thereby exposing a portion of the semiconductor material adjacent the remaining first and second layers.

12. The method according to claim 8, further comprising forming the first layer of a first thickness, forming the second layer with a second thickness and forming the third layer with a third thickness, whereby the three layers form part of the thick gate region and the combined effective thickness of the three layers is about 8 nm.

13. The method according to claim 12, wherein the third dielectric layer, that forms part of the thin gate region, has a thickness that is less than the first thickness of the first layer of the thick gate region.

14. The method according to claim 8, wherein the third layer is oxidized nitride.

15. The method according to claim 8, wherein the first and second layers are selected from at least one of the following: silicon dioxide, silicon nitride, silicon oxynitride, silicon oxyfluoride or phospho-silicate glass.

16. The method according to claim 12, wherein the thick gate region has dielectric layers of dissimilar materials, thereby improving dielectric quality in the thick gate region.

17. A method of manufacturing a semiconductor device, comprising:

providing a first layer of a dielectric material over a semiconductor material;

covering the first layer with a protective second dielectric layer adapted to mask the first layer;

forming a photoresist layer over a portion of the second protective layer;

removing the portion of the second layer not covered by the photoresist layer and then removing the photoresist layer;

removing the first layer over a region of the semiconductor material while using the second layer as a mask to protect a portion of the first layer, therein leaving a region of the semiconductor material adjacent to the two layers substantially exposed;

forming a third layer of dielectric material over the first and second layers and the adjacent exposed semiconductor material region;

depositing a gate material over the third dielectric layer; and etching the gate material layer through to said semiconductor material to form a thick gate region and a thin gate region on the semiconductor material.

18. A semiconductor device manufactured by the method of claim 17.

19. A method of manufacturing a semiconductor device, comprising: providing a first layer of a dielectric material over a semiconductor material;

covering the first layer with a protective second dielectric layer adapted to mask the first layer;

forming a third dielectric layer over the second layer;

forming a photoresist layer over a portion of the third layer, removing a portion of the third layer not covered by the photoresist layer and removing the photoresist layer to form a dielectric mask from the third layer that is disposed over a portion of the second layer;

removing a portion of the second layer not covered by the dielectric mask, leaving a portion of the first layer adjacent to the second and third layers substantially exposed;

removing the dielectric mask and the exposed portion of the first layer, leaving an exposed semiconductor region adjacent the first and second layers;

depositing a fourth layer of dielectric material over the first and second layers and the adjacent exposed semiconductor material region;

depositing a gate material over the fourth dielectric layer; and etching the gate material layer through to the semiconductor material to form a thick gate region and a thin gate region on the semiconductor material.

20. A semiconductor device manufactured by the method of claim 19.

* * * * *